(12) United States Patent
Gater

(10) Patent No.: US 6,411,130 B1
(45) Date of Patent: Jun. 25, 2002

(54) METHOD AND SYSTEM FOR RELIABLY PROVIDING A LOCK INDICATION

(75) Inventor: Christian Gater, Dunblane (GB)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 09/769,059

(22) Filed: Jan. 23, 2001

(51) Int. Cl.[7] .............................................. H03D 13/00
(52) U.S. Cl. ......................................... 327/12; 327/147
(58) Field of Search .............................. 327/3, 2, 7, 12, 327/147, 156, 151, 160, 162, 163; 375/376, 375, 373, 327; 331/25, 1 R, DIG. 2

(56) References Cited

U.S. PATENT DOCUMENTS

| | | | | |
|---|---|---|---|---|
| 5,056,118 A | * | 10/1991 | Sun ............................. | 375/342 |
| 5,172,396 A | * | 12/1992 | Rose, Jr. et al. ............ | 375/356 |
| 5,557,224 A | * | 9/1996 | Wright et al. ................ | 327/147 |
| 5,694,088 A | * | 12/1997 | Dickson ...................... | 331/1 R |
| 5,952,888 A | * | 9/1999 | Scott ...................... | 331/DIG. 2 |
| 6,081,572 A | * | 6/2000 | Filip .......................... | 375/376 |
| 6,115,438 A | * | 9/2000 | Andressen ................... | 375/373 |
| 6,194,939 B1 | * | 2/2001 | Omas ......................... | 327/160 |

* cited by examiner

Primary Examiner—Toan Tran
Assistant Examiner—Linh Nguyen
(74) Attorney, Agent, or Firm—Sawyer Law Group LLP

(57) ABSTRACT

In a first aspect, a lock indicator circuit is disclosed. The lock indicator comprises a first circuit for providing a first beat signal; and a second circuit for providing a second beat signal. A reference clock signal and a recovered clock signal are provided in a reversed manner to the first and second circuits. In a second aspect, a method for providing a lock indication of a circuit is disclosed. The method comprises the steps of providing a first and second beat signals; and utilizing the first and second beat signals to determine if a lock condition has occurred. A system and method in accordance with the present invention indicates a lock to the desired reference clock and provides an error or out of lock condition if the recovered frequency is at a harmonic or subharmonic of the reference frequency. This ability to avoid a false lock indication requires very little additional circuitry. A further improvement is that the circuit correctly indicates out of lock condition even in the absence of a reference frequency, caused for instance by a broken signal connection.

14 Claims, 7 Drawing Sheets

METHOD AND SYSTEM FOR RELIABLY PROVIDING A LOCK INDICATION

FIELD OF THE INVENTION

The present invention relates generally to lock detection circuits and more particularly to a lock indicator circuit which reliably locks over a wide range of frequencies.

BACKGROUND OF THE INVENTION

Lock detector circuits are well known and utilized extensively to ensure that a circuit is operating at a particular frequency. FIG. 1 is a block diagram of a conventional lock indication circuit 10 that generates a beat frequency that is proportional to a difference in frequencies of two signals. This circuit 10 is the basis of a frequency lock detection system by further processing of the beat signal.

The lock detector circuit 10 includes a beat generator circuit 11. The beat generator circuit 11 comprises a flip flop 12 which receives a reference clock signal at a data input, a recovered clock signal (or clock signal) at a clock input and a reset signal at a clear input. A first output signal is coupled to a delay element 14 which provides an input to a logical operator, in this case, an exclusive OR gate 16. In addition, a second output signal is provided directly to the logical operator 16 from the output of the flip-flop 12. The exclusive OR gate 16 then provides a beat signal which is proportional to the difference in frequencies of the reference clock signal and the recovered clock signal. The beat signal is provided along with the two clock signals to an oscilloscope 22.

FIG. 2 illustrates the reference clock, recovered clock and beat frequency signals produced for the detection circuit 10. As is seen in FIG. 2, the operation of the conventional lock detection circuit 10 is shown for the case where the reference clock frequency equals 1.1 times the recovered clock frequency. As the reference clock gets closer in frequency to the recovered clock, the beat frequency reduces. As the two clocks get further apart, the beat frequency increases. Accordingly, when the reference clock equals the recovered clock, no beat occurs and the signal can be used to indicate an in-lock condition. Typically these circuits do not reliably indicate lock over wide frequency differences between the recovered and reference frequencies. The lock indication typically fails if the reference is at a harmonic or subharmonic of the recovered frequency unless an elaborate frequency measurement technique is employed.

To illustrate this problem, refer now to FIG. 3. FIG. 3 illustrates the signals of FIG. 2 when the reference clock frequency is an even number times the recovered clock frequency. As is seen, the circuit 10 fails when the reference clock is exactly P times the recovered clock frequency, where P is an even number times the clock frequency because no beat signal is produced and a lock condition is falsely indicated.

Accordingly, for applications where the recovered and reference clock frequencies are known beforehand to be within tight limits (+/−25%) then the above identified circuit 10 operates reliably as a lock detector. If the clock frequencies are not known beforehand and these limits are exceeded the lock detector circuit 10 can fail for the above-identified reasons.

Accordingly, what is needed is a system and method for providing a lock indicator which is more reliable over a wide range of frequencies than conventional systems. The present invention addresses such a need.

SUMMARY OF THE INVENTION

In a first aspect, a lock indicator circuit is disclosed. The lock indicator comprises a first circuit for providing a first beat signal; and a second circuit for providing a second beat signal. A reference clock signal and a recovered clock signal are provided in a reversed manner to the first and second circuits. In a second aspect, a method for providing a lock indication of a circuit is disclosed. The method comprises the steps of providing a first and second beat signals; and utilizing the first and second beat signals to determine if a lock condition has occurred.

A system and method in accordance with the present invention indicates a lock to the desired reference clock and provides an error or out of lock condition if the recovered frequency is at a harmonic or subharmonic of the reference frequency. This ability to avoid a false lock indication requires very little additional circuitry. A further improvement is that the circuit correctly indicates out of lock condition even in the absence of a reference frequency, caused for instance by a broken signal connection.

DETAILED DESCRIPTION

The present invention relates generally to lock detection circuits and more particularly to a lock indicator circuit which reliably locks over a wide range of frequencies. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In a system and method in accordance with the present invention, instead of utilizing a single beat generator, two beat generator circuits coupled in parallel are utilized to provide a lock indicator. Accordingly, in so doing the signals are reversed, that is, the reference clock on one beat generator is provided to the data input and the recovered clock signal is provided to the clock input, where in the other beat generator the recovered clock signal is provided to the data input and the reference clock signal is provided to the clock input. In so doing, the two signals can be compared to determine whether there is a false indication of a lock condition. To describe this operation in more detail, refer now to the following description in conjunction with the accompanying figures.

Figure 1:
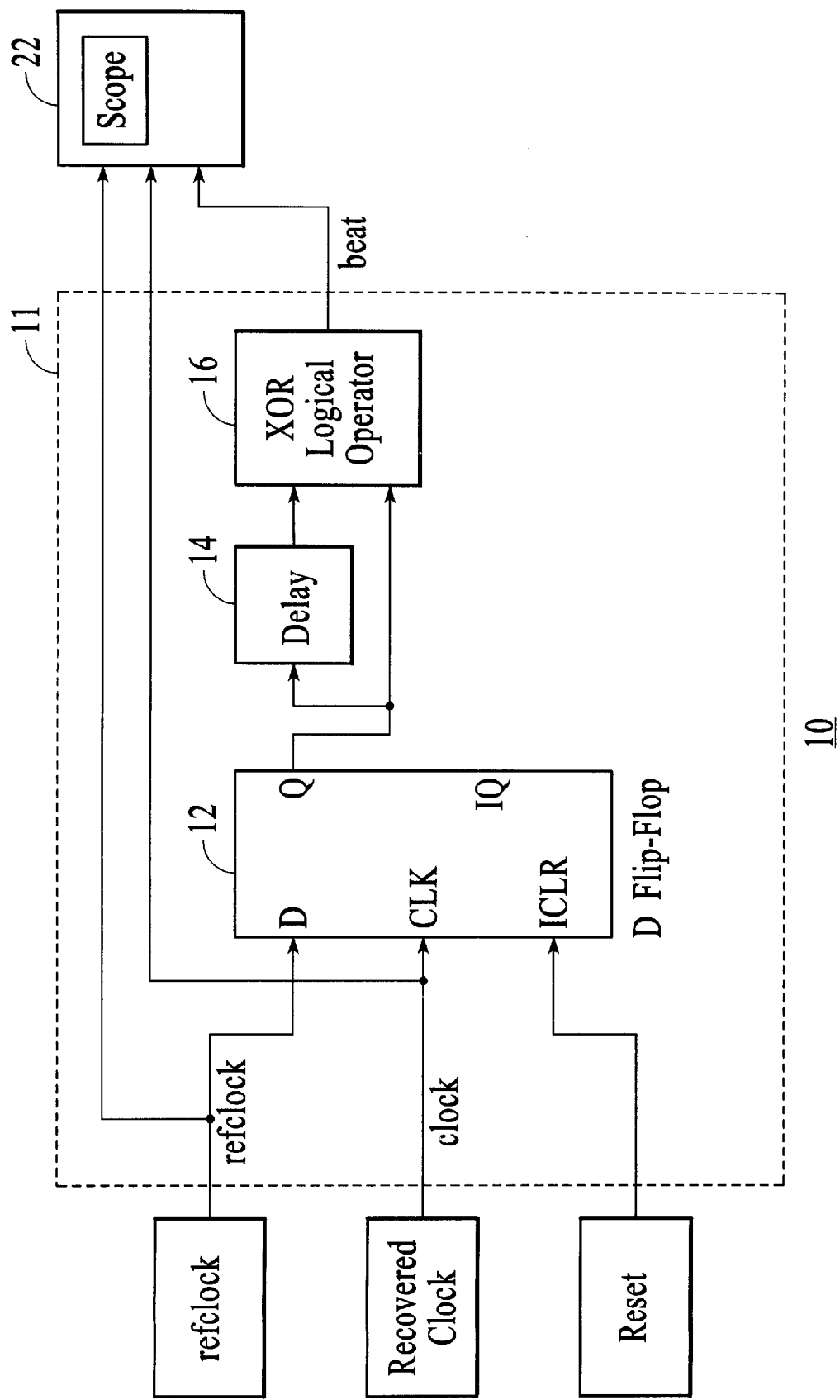
FIG. 1 is a block diagram of a conventional lock detector circuit that generates a beat frequency that is proportional to a difference in frequencies of the two clock signals.
Figure 2:
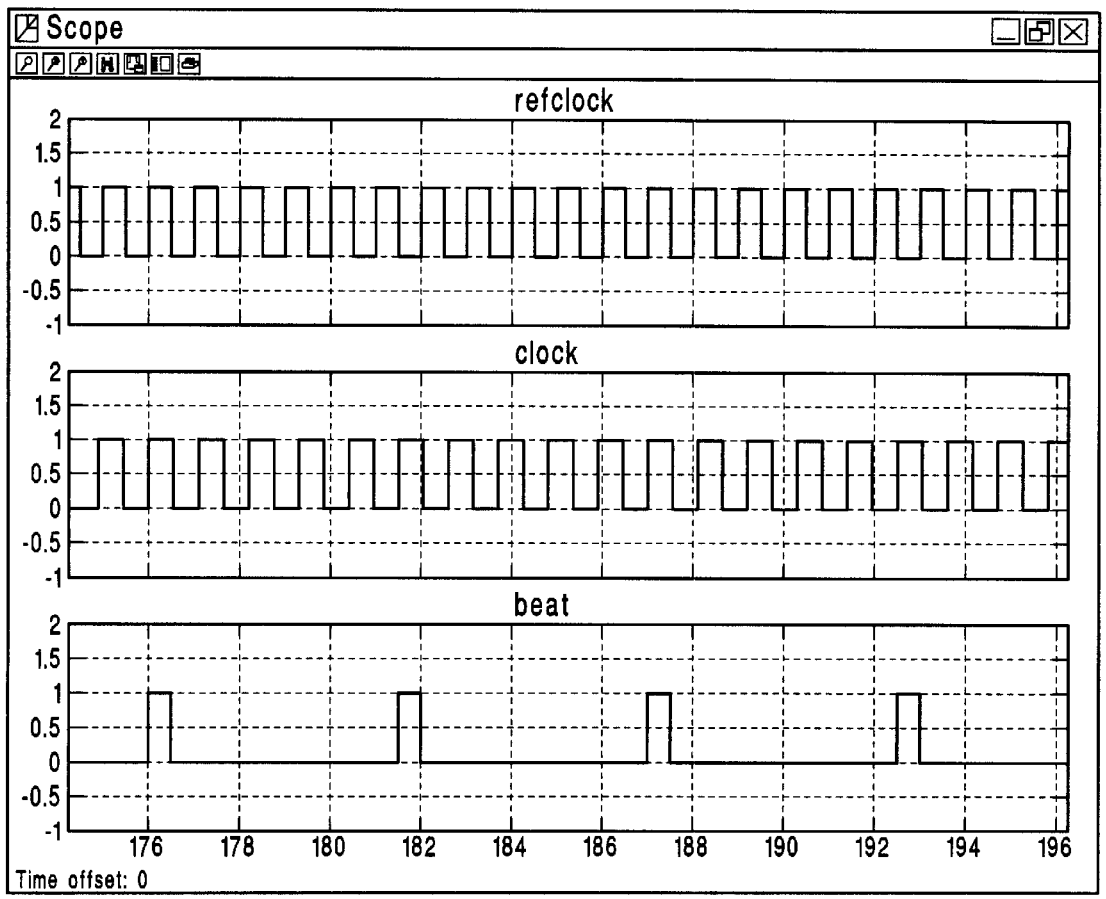
FIG. 2 illustrates the clock, reference clock and beat frequency signals produced for the detection circuit of FIG. 1.
Figure 4:
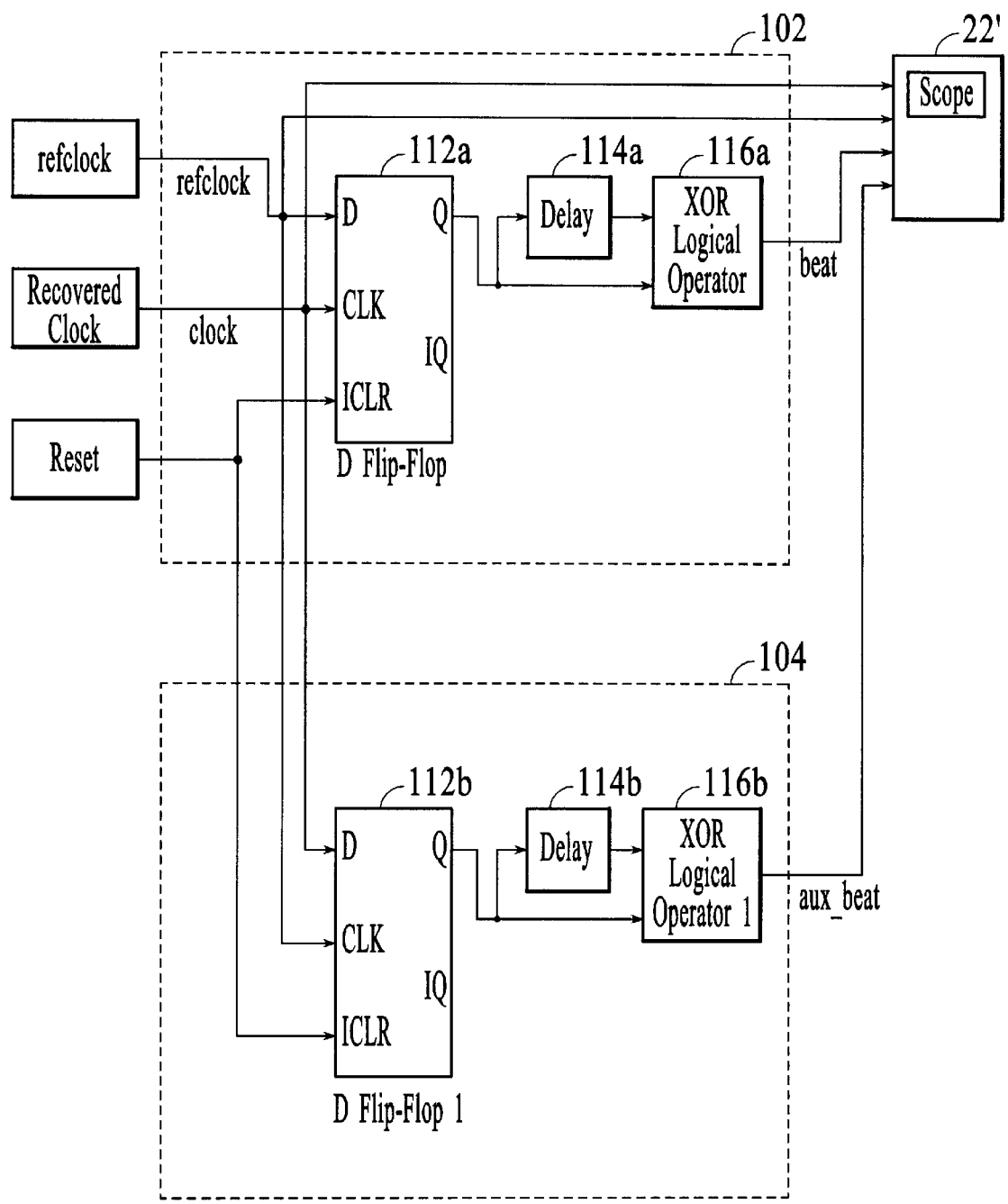
FIG. 4 is a block diagram of a lock indicator circuit in accordance with the present invention.

FIG. 4 is a block diagram of a lock indicator circuit 100 in accordance with the present invention. The circuit 100 includes first and second beat generator circuits 102 and 104 which are in parallel. The first beat generator circuit 102 provides a first beat signal. The second or auxiliary generator circuit 104 provides a second beat signal. The elements of each of the beat generator circuits 102 and 104 are similar to those of the beat generator circuit 11 of FIG. 1. However, as is seen, the beat generator circuits 102 and 104 receive the reference clock signal and recovered clock signal on reversed inputs. That is, the flip-flop 12a of circuit 102 receives the reference clock signal on the data input and the recovered clock signal on the clock input to provide a first beat signal (beat) while flip-flop 112b of circuit 104 receives the recovered clock of the clock input and the reference clock on the data input to provide a second or auxiliary beat signal (aux_beat). This aux_beat signal can then be processed to eliminate false clock conditions. To describe this feature refer to the following.

Figure 3:
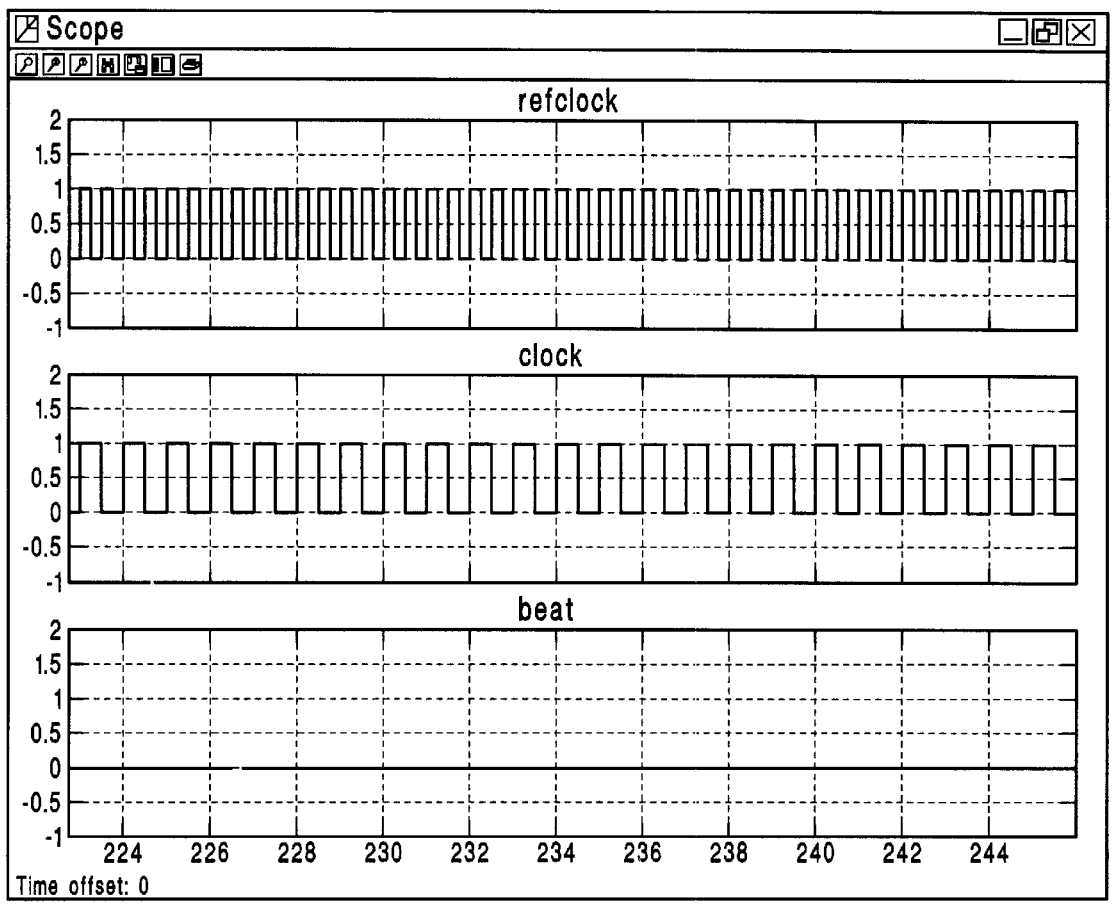
FIG. 3 illustrates the signals of FIG. 2 when the reference clock frequency is an even number times the recovered clock frequency.
Figure 5:
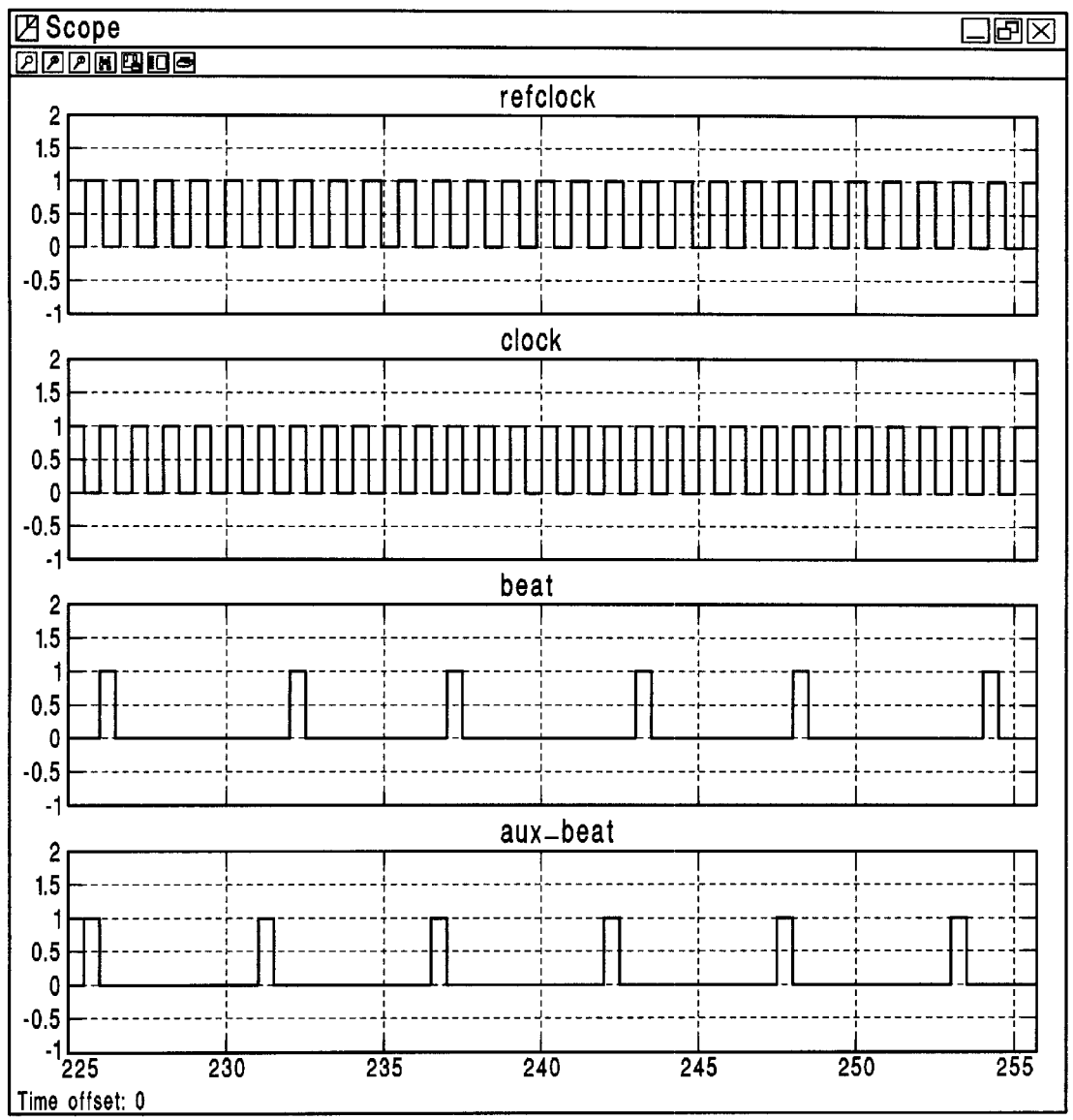
FIG. 5 illustrates the reference and recovered clock signals when they are within the normal operating range.
Figure 6:
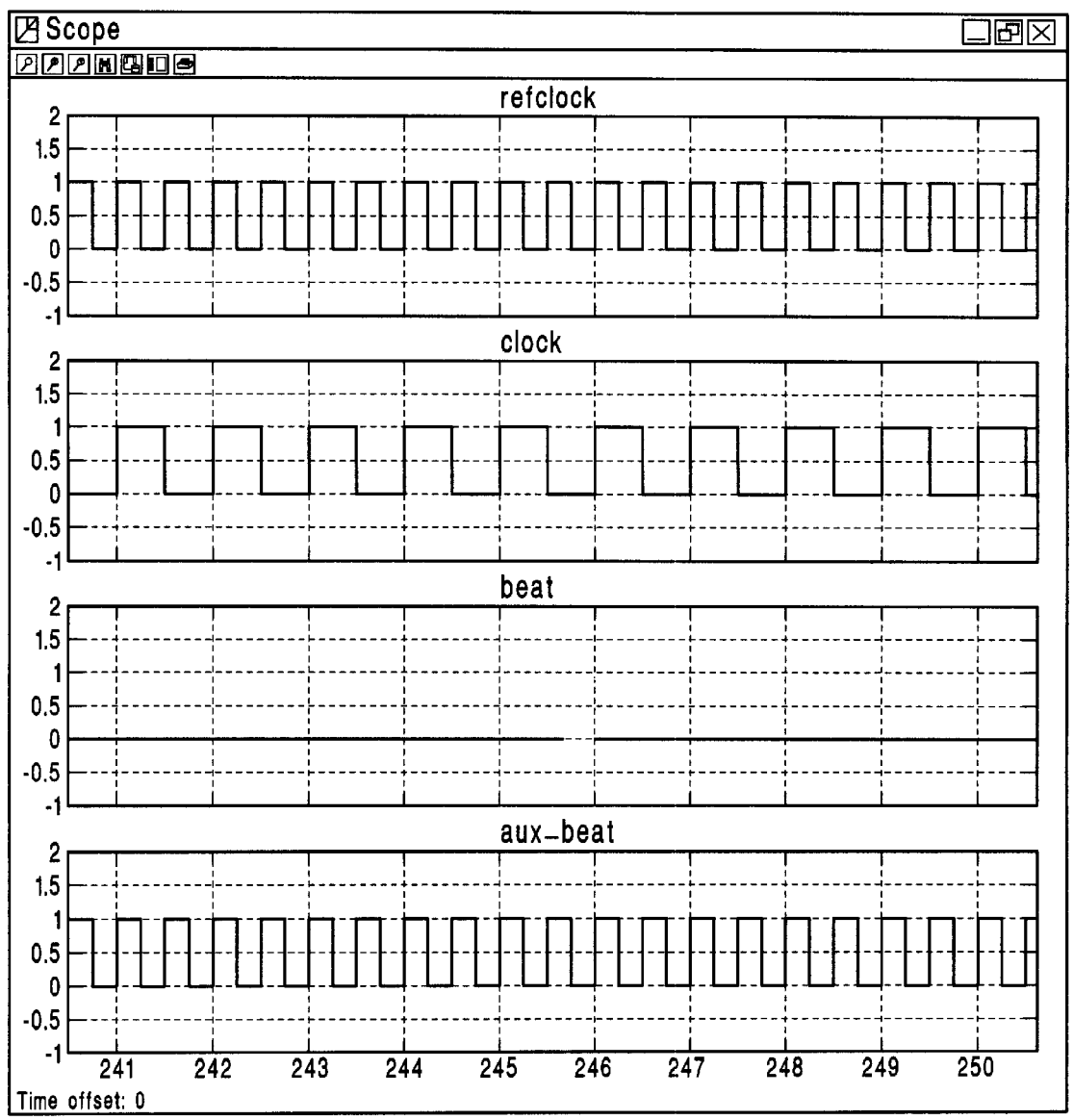
FIG. 6 indicates that when the condition shown in FIG. 3 occurs, the aux_beat signal indicates that the potential lock indication is false.

Referring now to FIG. 5, when the referenced and recovered clock signals are in the normal operating range. FIG. 6 indicates that when the condition shown in FIG. 3 occurs, the aux_beat signal indicates that the potential lock indication is false. An efficient lock detection system can then be designed using both beat and aux_beat signals for the lock detector circuit 100.

Figure 7:
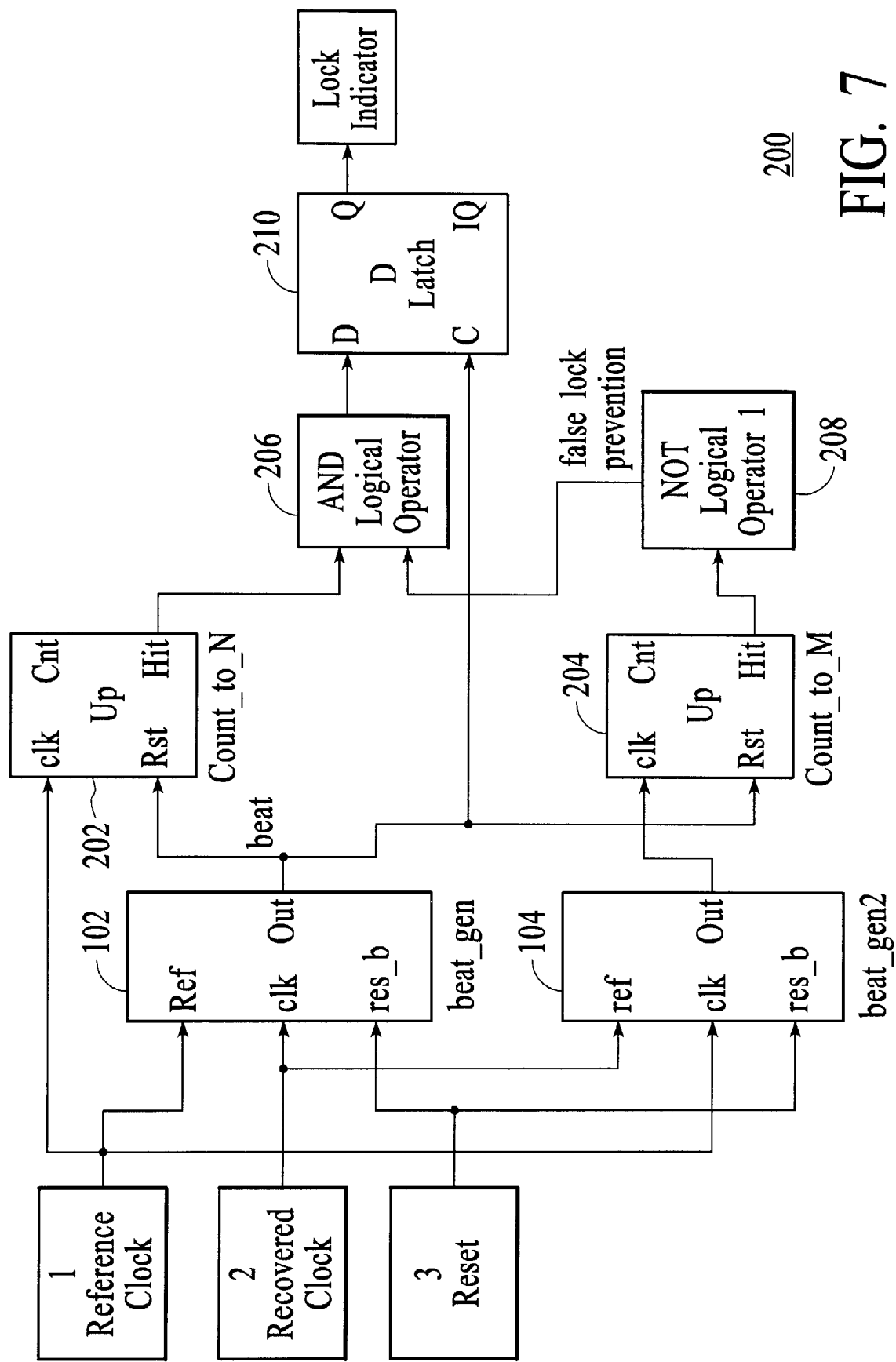
FIG. 7 is a block diagram of a lock detector system in accordance with the present invention.

FIG. 7 is a block diagram of an indicator circuit 200 in accordance with the present invention. This detection system 200 utilizes lock indicator circuit 100 coupled to first and second counters 202 and 204. The output of counter 202 is coupled to a first logical operator or AND gate 206. The output of counter 204 is coupled to a second logical operator 208. The output of the second logical operation is provided to an input of the AND gate 206. The output of AND gate 206 is provided to the data input of a latch 210. The beat signal is provided to the clock input of the latch. The output of the latch provides the lock indication. Here counter 202 is used to indicate normal lock, where N is set depending upon the frequency difference at which the circuit should flag a lock condition. The counter 204 is used to gate the counter 202 output and prevent a false lock indication. Under normal operation, counter 204 never receives enough count pulses to hit its maximum count value before being reset by the primary beat signal. Only when in a potentially false lock condition and the beat signal is static, will the counter 204 hit its count value and prevent false lock indication. M need only be set to a low value, 4 for example. Another improvement is apparent in this embodiment; that is that the reference clock signal feeds the reference clock input of the primary beat generator circuit 102. This prevents a false lock condition if the reference lock signal is not present at all. To further validate the lock indication generated by this circuit, the clock inputs could also be monitored for loss of signal caused for instance by a broken connection.

A system and method in accordance with the present invention indicates a lock to the desired reference clock and provides an error or out of lock condition if the recovered frequency is at a harmonic or subharmonic of the reference frequency. This ability to avoid a false lock indication requires very little additional circuitry. A further improvement is that the circuit correctly indicates out of lock condition even in the absence of a reference frequency, caused for instance by a broken signal connection.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A lock indicator circuit comprising:

a first circuit for providing a first beat signal; and a second circuit for providing a second beat signal, wherein a reference clock signal and a recovered clock signal are provided in a reversed manner to the first and second circuits, wherein each of the first and second circuits comprises:
  a flip flop for receiving the reference clock signal and the recovered clock signal;
  a delay element coupled to the flip flop; and
  a logical operator element coupled to the delay element and the flip flop for providing a beat signal.

2. The lock indicator of claim 1 wherein the flip flop comprises a D-flip flop or any other mixing element.

3. The lock indicator of claim 1 wherein the logical operator element comprises an exclusive OR gate or any circuit capable of detecting edge transitions.

4. The lock indicator of claim 1 wherein the first and second beat signals are utilized to determine if a lock condition has occurred.

5. The lock indicator of claim 1 wherein a reset signal is provided to the first and second circuits.

6. A method for providing a lock indication of a circuit, the method comprising the steps of:

(a) providing first and second beat signals, wherein the providing step (a) further comprises the steps of:
  (a1) providing a reference clock signal to each of the first and second circuits;
  (a2) providing a recovered clock signal to each of the first and second circuits; wherein the reference clock signal and the recovered clock signal are provided in a reversed manner to the first and second circuits;
  (a3) providing the first and second beat signals from the first and second circuits; and providing a reset signal to each of the first and second circuits; and (b) utilizing the first and second beat signals to determine when a lock condition has occurred.

7. A lock indicator circuit comprising:

a first circuit for providing a first beat signal;

a second circuit for providing a second beat signal, wherein a reference clock signal and a recovered clock signal are provided in a reversed manner to the first and second circuits;

a first counter element coupled to the first circuit for indicating a normal lock condition;

a second counter element coupled to the first and second circuits for a false lock indication; and a latch coupled to the first and second counter elements for providing a lock indication.

8. The lock indicator circuit of claim 7 in which each of the first and second circuits comprises:

a flip flop for receiving the reference clock signal and the generated clock signal;

a delay element coupled to the flip flop;

a logical operator element coupled to the delay element and the flip-flop for providing a beat signal.

9. The lock indicator of claim 8 wherein the flip-flop comprises a mixing element.

10. The lock indicator of claim 8 wherein the flip-flop comprises a D-flip-flop.

11. The lock indicator of claim 7 wherein the logical operator element comprises a circuit capable of detecting edge transitions.

12. The lock indicator of claim 8 wherein the flip-flop comprises an exclusive OR gate.

13. The lock indicator of claim 7 wherein the first and second beat signals are utilized to determine when a lock condition has occurred.

14. The lock indicator of claim 7 wherein a reset signal is provided to the first and second circuits.

* * * * *